United States Patent [19]
Tanaka

[11] Patent Number: 5,875,392
[45] Date of Patent: Feb. 23, 1999

[54] FREQUENCY MIXER CIRCUIT RECEIVING AN UNBALANCED SIGNAL AND OUTPUTTING AN OUTPUT VOLTAGE HAVING A MINIMIZED OFFSET VOLTAGE

[75] Inventor: Toshiyuki Tanaka, Tokyo, Japan

[73] Assignee: NEC Corporation, Tokyo, Japan

[21] Appl. No.: 705,828

[22] Filed: Aug. 30, 1996

[30] Foreign Application Priority Data

Aug. 30, 1995 [JP] Japan .................................. 7-222387

[51] Int. Cl.$^6$ ..................................................... H04B 1/28
[52] U.S. Cl. ......................................... 455/333; 455/326
[58] Field of Search .................................. 455/323, 326, 455/190.1, 313, 314, 333; 327/113, 355; H04B 1/28

[56] References Cited

U.S. PATENT DOCUMENTS

| | | | |
|---|---|---|---|
| 4,480,337 | 10/1984 | Graziadei et al. ....................... | 455/333 |
| 4,931,746 | 6/1990 | Trankle et al. .......................... | 455/333 |
| 5,172,079 | 12/1992 | Shigenari ................................ | 332/168 |
| 5,379,457 | 1/1995 | Nguyen ................................... | 455/323 |
| 5,483,696 | 1/1996 | Wheatley, III et al. ................. | 455/326 |
| 5,530,928 | 6/1996 | Wheatley, III .......................... | 455/326 |
| 5,548,840 | 8/1996 | Heck ....................................... | 455/326 |
| 5,589,791 | 12/1996 | Gilbert .................................... | 455/326 |
| 5,678,226 | 10/1997 | Li et al. .................................. | 455/333 |

OTHER PUBLICATIONS

John F. Wilson et al., "A Single–Chip VHF and UHF Receiver for Radio Paging", *IEEE J. Solid–State Circuits*, vol. SC–26, No. 12, Dec. 1991, pp. 1944–1950.

*Primary Examiner*—Tommy P. Chin
*Assistant Examiner*—Vu Le
*Attorney, Agent, or Firm*—Sughrue, Mion, Zinn, Macpeak & Seas, PLLC

[57] ABSTRACT

A frequency mixer circuit comprises a first differential circuit composed of first and second transistors having common-connected emitters, and a second differential circuit composed of third and fourth transistors having common-connected emitters. A collector of the first transistor is connected to a collector of the third transistor and also connected through a first resistor to Vcc. A collector of the second transistor is connected to a collector of the fourth transistor and also connected through a second resistor to Vcc. A base of the first transistor is connected to a base of the fourth transistor, and a base of the second transistor is connected to a base of the third transistor. An emitter-grounded, fifth transistor is connected at its collector to the common-connected emitters of the first and second transistors, so as to constitute a current source for driving the first differential circuit. An emitter-grounded, sixth transistor is connected at its collector to the common-connected emitters of the third and fourth transistors, so as to constitute a current source for driving the second differential circuit. The base of the first to fourth transistors are biased with a first bias voltage, and a first high frequency signal is applied in the form of an unbalanced signal to the base of the first and fourth transistors. The base of the fifth and sixth transistors are biased with a second bias voltage, and a second high frequency signal is applied in the form of an unbalanced signal to the base of the fifth transistor.

3 Claims, 2 Drawing Sheets

FREQUENCY MIXER CIRCUIT RECEIVING AN UNBALANCED SIGNAL AND OUTPUTTING AN OUTPUT VOLTAGE HAVING A MINIMIZED OFFSET VOLTAGE

BACKGROUND OF THE INVENTION

1. Field of the Invention

The present invention relates to a frequency mixer circuit, and more specifically to a frequency mixer circuit of a direct conversion type for use in a receiving circuit such as a radio pager.

2. Description of Related Art

In the prior art, this type of frequency mixer circuit has been used in a circuit such as a radio pager receiving circuit which is required to operate with a low voltage. The frequency mixer circuit can be divided into two circuit types, namely, a single-balanced type, which is more general in the prior art and which will be called hereinafter a "first prior art frequency mixer circuit", and a double-balanced type which will be called hereinafter a "second prior art frequency mixer circuit".

Referring to FIG. 1, there is shown a circuit diagram of a typical example of the first prior art frequency mixer circuit. This first prior art frequency mixer circuit includes a differential circuit 10 composed of a pair of transistors Q7 and Q8 having their collector connected to a power supply voltage VCC through load resistors RL3 and RL4, respectively, their base biased with a bias voltage VBB3, and their emitter common-connected to each other, and an emitter-grounded, current source transistor Q9 having a collector connected to the common-connected emitters of the transistors Q7 and Q8, and a base biased with a biais voltage VBB4.

Now, operation of the first prior art frequency mixer circuit will be described with reference to FIG. 1.

A high frequency signal V1, which is constituted of a local oscillation signal, is supplied to only the base of the transistor Q7 in the differential circuit 10, and on the other hand, another high frequency signal V2, which is constituted of a received signal, is supplied to the base of the transistor Q9. In addition, the collector of the transistors Q7 and Q8 are connected to output terminals T1 and T2, respectively, between which an output voltage VO appears. With this arrangement, assuming that respective frequencies of the high frequency signals V1 and V2 are f1 and f2, the output voltage VO includes a frequency sum component f1+f2 and a frequency difference component If |f1−f2|, and therefore, the shown circuit operates as a frequency mixer.

However, since the high frequency signal V1 constituted of the local oscillation signal, is a large-amplitude signal for alternately causing, the transistors Q7 and Q8 to flow the collector current, but since the high frequency signal V1 is supplied to only the base of the transistor Q7 in the form of an unbalanced signal, in the operation of the circuit there occurs a period in which only the transistor Q7 in the differential circuit is put in a saturated condition or in a condition near to the saturated condition. In this connection, such a phenomenon is known that, in the saturated condition of a turned-on transistor, electric charges are accumulated between the base and the emitter of the turned-on transistor, and therefore, when it is attempted to cut off the transistor, the transistor is not instantly turned off by action of the accumulated electric charges. With the action of electric charges accumulated between the base and the emitter of the transistor Q7 during a turned-on period of the transistor Q7 because of the same action as the above mentioned phenomenon, the turned-on period of the transistor Q7 becomes longer than that of the transistor Q8, and therefore, an averaged collector current of the transistor Q7 becomes different from that of the transistor Q8. As a result, a difference occurs between an averaged voltage on the output terminal T1 and an averaged voltage on the output terminal T2. Namely, an offset voltage occurs between the output terminals T1 and T2.

In a front-end circuit such as the radio pager operating with a low voltage, a high conversion gain and a low noise factor (NF) can be obtained when an output is balanced. However, in the first prior art frequency mixer circuit as mentioned above, since the offset voltage occurs between the output terminals because of the above mentioned reason, it is necessary to take a countermeasure, for example, to capacitively couple between succeeding stages, in order to supply a balanced output to a next stage.

Here, considering to use the first prior art frequency mixer circuit in the direct conversion type radio pager receiver, since a modulated wave is directly converted into a base band signal of 4.5 kHz, the capacitive coupling to the next stage requires a capacitor having a large capacitance, which, however, is very difficult to be formed on an integrated circuit. If this large capacitance capacitor is provided externally to the integrated circuit, the number of external terminals and the number of externally mounted circuit parts are increased. This is a hindrance in miniaturizing and in reducing the number of parts.

Referring to FIG. 2, there is shown a circuit diagram of a typical example of the second prior art frequency mixer circuit of the double-balanced type, which is disclosed by John F. Wilson et al, "A Single-Chip VHF and UHF Receiver for Radio Paging", IEEE Journal of Solid-State Circuits, Vol.SC-26, No.12, pp.1944–1950, Dec. 1991, and by Y. MORI, "Pager Receiver Design Technology", Chapter 3: Direct-Conversion system, pp.95–116, published from K. K. Torikeppusu, 1994, both of which disclose an elementary technology for the pager receiver, and the disclosure of which is incorporated by reference it their entirety into this application.

This second prior art frequency mixer circuit includes a first differential circuit 12 composed of a pair of transistors Q1 and Q2 having their emitter common-connected to each other, a second differential circuit 14 composed of a pair of transistors Q3 and Q4 having their emitter common-connected to each other, and a pair of current source transistors Q10 and Q11 having their collector connected to the conmmon-connected emitters of the transistors Q1 and Q2 of the differential circuit 12 and the common-connected emitters of the transistors Q3 and Q4 of the differential circuit 14, respectively. A base of each of the current source transistors Q10 and Q11 is connected to receive a bias voltage VBB5, and an emitter of the current source transistors Q10 and Q11 are connected to ground through resistors RE1 and RE2, respectively, A collector of the transistors Q1 and Q3 are connected to each other, and also connected to an output terminal T1 and througah a load resistor RL1 to the power supply voltage VCC. A collector of the transistors Q2 and Q4 are connected to each other, and also connected to an output terminal T2 and through a load resistor RL2 to the power supply voltage VCC. A base of the transistors Q1 and Q4 are connected to each other, and a base of the transistors Q2 and Q3 are connected to each other.

A high frequency signal V1, which is constituted of a local oscillation signal, is supplied between the base of the transistor Q1 and the base of the transistor Q2, and on the other hand, another high frequency signal V2, which is constituted of a received signal, is supplied between the emitter of the transistor Q10 and the emitter of the transistor Q11. An output voltage VO is outputted between the terminals T1 and T2.

Similarly to the first prior art frequency mixer circuit, the output voltage VO of this second prior art frequency mixer circuit includes a frequency sum component f1+f2 and a frequency difference component |f1−f2| of the frequencies f1 and f2 of the high frequency signals V1 and V2, and therefore, the circuit operates as a frequency mixer.

Thus, a circuit portion operating to respond to the high frequency signal V1 is constituted to take a double-balanced structure by using the two differential circuits 12 and 14, and the high frequency signal V1 is inputted in the form of a balanced signal. Therefore, the above mentioned alternate turning-on of the differential pair transistors causes no difference in the averaged collector currents. As a result, an averaged voltage on the output terminal T1 and an averaged voltage on the output terminal T2 become the same constant level, and therefore, no offset voltage occurs between the output terminals T1 and T2. Accordingly, the circuit can be directly coupled to a next stage of circuit.

In the second prior art frequency mixer circuit, however, since each of the high frequency signals V1 and V2 is inputted in the form of a balanced signal, the circuit needs four input external terminals for receiving the two high frequency signals V1 and V2 when the frequency mixer circuit is implemented in a bipolar transistor integrated circuit. In addition, in order to convert the conventional unbalanced signal into a balanced signal, a circuit part such as a transformer is additionally required. Therefore, similarly to the first prior art frequency mixer circuit, the number of external terminals and the number of externally mounted circuit parts are increased. This is a hindrance in miniaturizing and in reducing the number of parts.

Furthermore, if the second prior art frequency mixer circuit is operated with a low power supply voltage as in the radio pager receiver, since the emitter resistors RE1 and RE2 are inserted between the emitter of the transistors Q10 and Q11 and the ground, there occurs a voltage loss corresponding to a voltage drop across the resistors RE1 and RE2. This is also a disadvantage of the second prior art frequency mixer circuit.

SUMMARY OF THE INVENTION

Accordingly, it is an object of the present invention to provide a frequency mixer circuit which has overcome the above mentioned defects of the conventional ones.

Another object of the present invention is to provide a frequency mixer circuit capable of receiving, in the form of an unbalanced signal, the two high frequency signals corresponding to the local oscillation signal and the received signal, and of generating an output voltage having a minimized offset voltage.

The above and other objects of the present invention are achieved in accordance with the present invention by a frequency mixer circuit comprising:

a first differential circuit composed of first and second transistors having common-connected emitters, and a second differential circuit composed of third and fourth transistors having common-connected emitters, a collector of the first transistor being connected to a collector of the third transistor and also connected through a first resistor to a first power supply voltage, a collector of the second transistor being connected to a collector of the fourth transistor and also connected through a second resistor to the first power supply voltage, a base of the first transistor being connected to a base of the fourth transistor, and a base of the second transistor being connected to a base of the third transistor; and a fifth transistor having a collector connected to the common-connected emitters of the first and second transistors and an emitter connected to a second power supply voltage, and a sixth transistor having a collector connected to the common-connected emitters of the third and fourth transistors and an emitter connected to the second power supply voltage, the base of the first to fourth transistors being biased with a first bias voltage, and a first high frequency signal being applied in the form of an unbalanced signal to the base of the first and fourth transistors, aind the base of the fifth and sixth transistors being biased with a second bias voltage, and a second high frequency signal being applied in the form of an unbalanced signal to the base of the fifth transistor.

The above and other objects, features and advantages of the present invention will be apparent from the following description of preferred embodiments of the invention with reference to the accompanying drawings.

BREIF DESCRIPTION OF THE DRAWINGS

DESCRIPTION OF THE PREFERRED EMBODIMENTS

Figure 1:
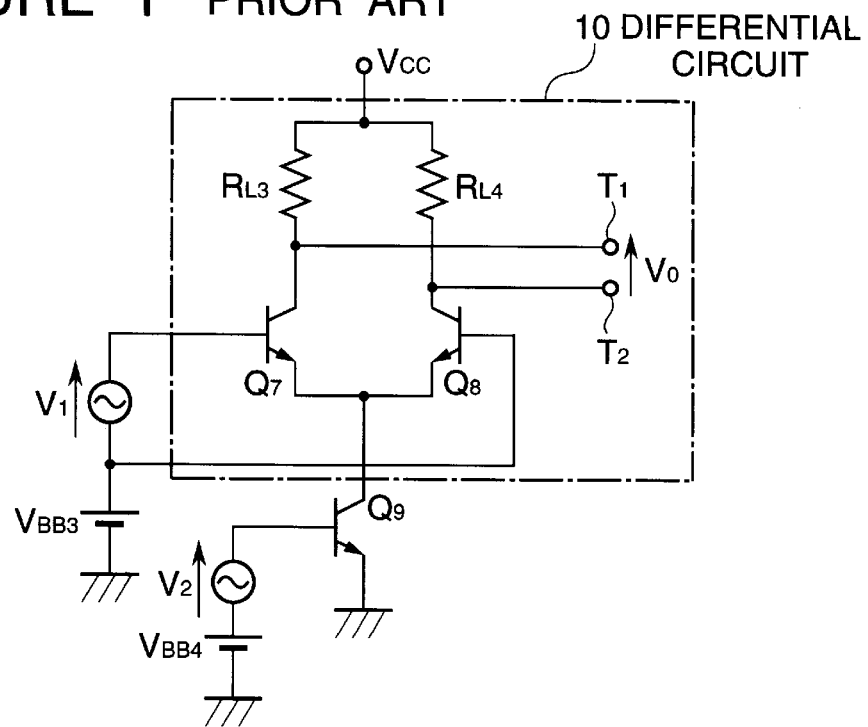
FIG. 1 is a circuit diagram of a typical example of the first prior art frequency mixer circuit.
Figure 2:
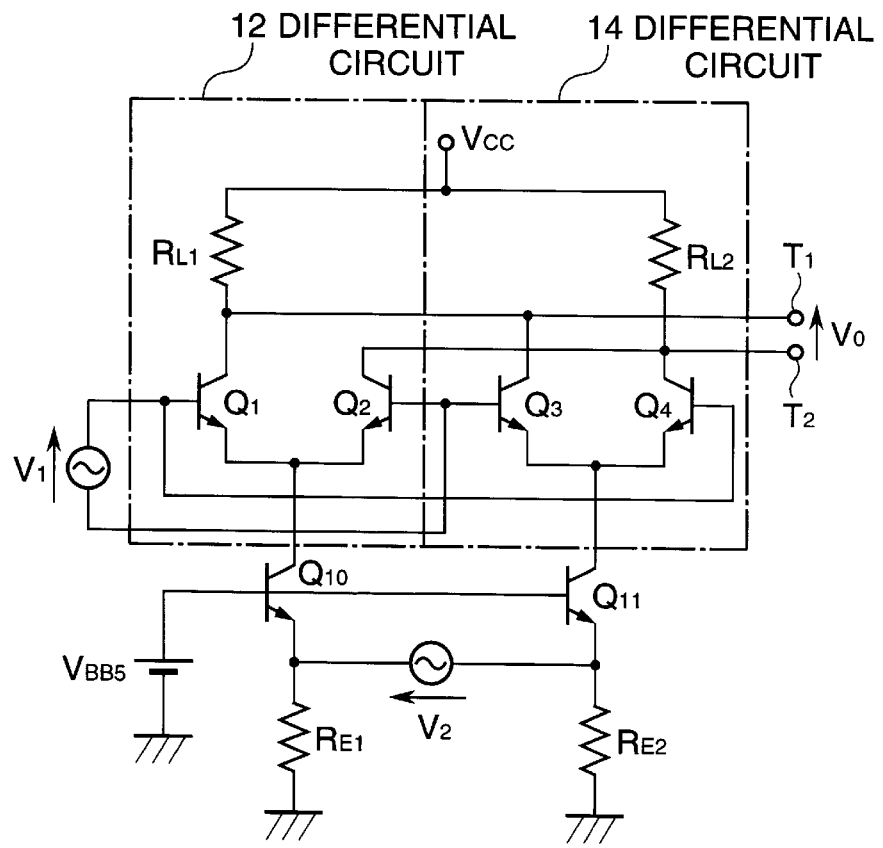
FIG. 2 is a circuit diagram of a typical example of the second prior art frequency mixer circuit.
Figure 3:
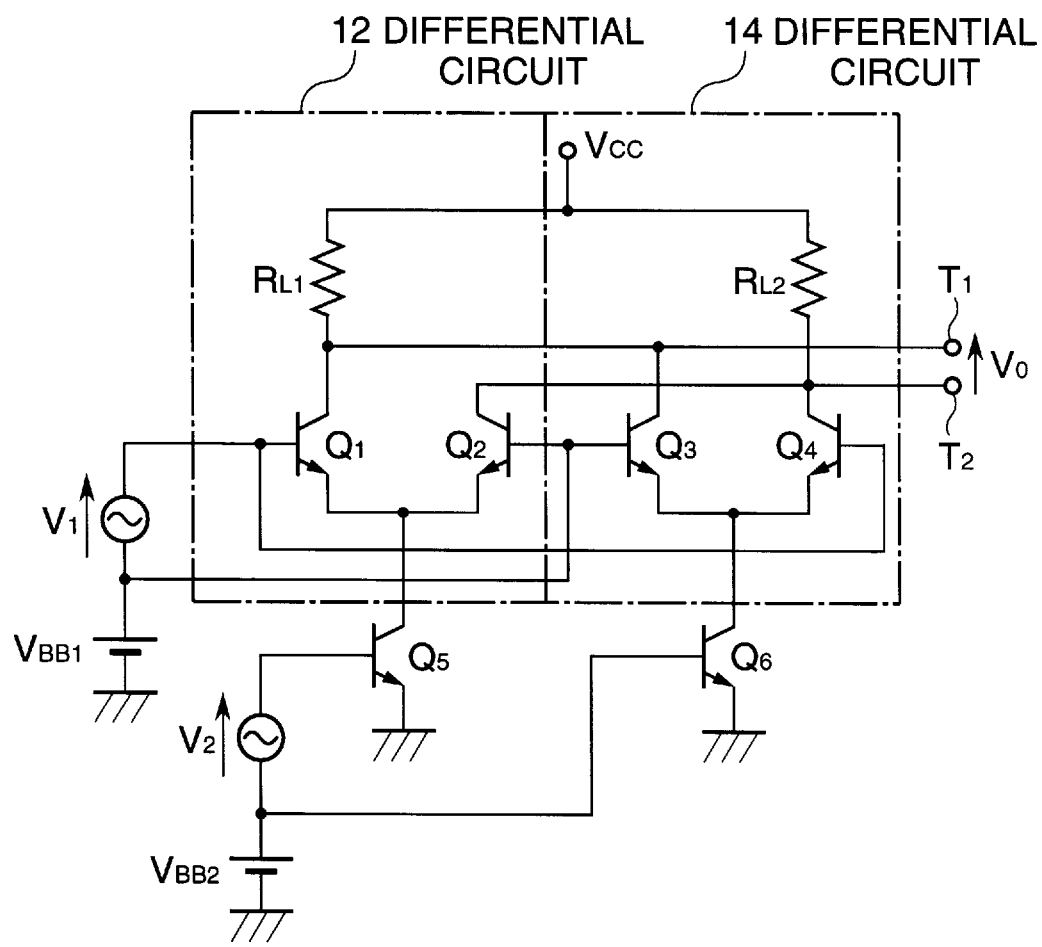
FIG. 3 is a circuit diagram of an embodiment of the frequency mixer circuit in accordance with the present invention.

Referring to FIG. 3, there is shown a circuit diagram of an embodiment of the frequency mixer circuit in accordance with the present invention. In FIG. 3, circuit elements corresponding to those shown in FIG. 2 are given the same Reference Numerals.

The shown embodiment includes the same differential circuits 12 and 14 as those of the second prior art frequency mixer circuit shown in FIG. 2, and a pair of emitter-grounded current source transistors Q5 and Q6. A collector of the transistor Q5 is connected to the common-connected emitters of the transistors Q1 and Q2, and a collector of the transistor Q6 is connected to the common-connected emitters of the transistors Q3 and Q4.

A first bias voltage VBB1 is supplied to the base of the transistors Q1, Q2, Q3 and Q4, and a second bias voltage VBB2 is supplied to the base of the transistors Q5 and Q6. A high frequency signal V1, which is a local oscillation signal, is supplied in the form of an unbalanced signal to the base of the transistors Q1 and Q4, and a high frequency signal V2, which is a received signal, is supplied in the form of an unbalanced signal to the base of the transistor Q5. More specifically, VBB1 is supplied to the base of the transistors Q2 and Q3, and VBB1+V1 is supplied to the base of the transistors Q1 and Q4. VBB2 is supplied to the base of the transistor Q6, and VBB2+V2 is supplied to the base of the transistor Q5.

Thus, similarly to the prior art example, an output voltage VO is outputted between the terminals T1 and T2.

Now, operation of the shown embodiment will be described.

When the circuit operates receiving the high frequency signals V1 and V2, the high frequency signal V1, which is the local oscillation signal having a large amplitude, is applied to only the transistors Q1 and Q4 in the two differential circuits 12 and 14, and therefore, there occurs a period in which only the transistors Q1 and Q4 are put in a saturated condition or in a condition near to the saturated condition. As mentioned hereinbefore, in the saturated conducting condition of a transistor, the transistor is not instantly turned off by action of electric charges accumulated between the base and the emitter of the transistor. With the action of the electric charges accumulated, the turned-on period of the transistors Q1 and Q4 becomes longer than that of the transistors Q2 and Q3, and therefore, an averaged collector current of the transistor Q1 becomes different from that of the transistor Q2 and an averaged collector current of the transistor Q3 becomes different from that of the transistor Q4. In the shown embodiment, however, since the transistors Q1 and Q2 and the transistors Q3 and Q4 of the two differential circuits 12 and 14 are connected in a double-balanced structure, an averaged value of the current flowing through the load resistor RL1 becomes equal to an averaged value of the current flowing through the load resistor RL2. As a result, no offset voltage occurs between the output terminals T1 and T2.

Furthermore, the high frequency signal V2, which is the received signal, is supplied in the form of an unbalanced signal to only the transistor Q5. Generally, this type of double-balanced circuit is used as an analog multiplier, and if the signal V2 is not supplied in the form of a balanced signal, a balanced condition of the circuit is destroyed, which results in generation of an offset voltage. However, in the radio pager receiver, this high frequency signal V2 corresponding to the received signal, is an extremely small signal having only a level which gives no adverse influence on the bias voltage of the circuit. Therefore, although the signal V2 is supplied in the form of an unbalanced signal, the DC bias voltage does not substantially change, with the result that, in principle, no offset voltage occur between the output terminals T1 and T2.

Furthermore, since the high frequency signal V2 is supplied in the form of an unbalanced signal to the base of only the transistor Q5 of the pair of current source transistors Q5 and Q6 which drive the differential transistor pairs Q1 and Q2 and Q3 and Q4 of the differential circuits 12 and 14, respectively, it becomes unnecessary to insert an emitter resistor between the ground and each of the transistors Q5 and Q6 in order to cause the signal V2 to be inputted in a balanced condition. Therefore, there occurs no voltage drop across the emitter resistor, and it becomes possible to operate under a voltage which is lower than the second prior art frequency mixer circuit by the voltage drop which would otherwise occur across the emitter resistor.

Finally, the embodiment of the frequency mixer circuit in accordance with the present invention and the first prior art frequency mixer circuit were compared by means of a computer simulation using the same transistor parameters. The parameters used are as follows: The collector current of the differential pair transistors is 150 $\mu$A, the power supply voltage VCC is 1.05 V, the load resistors RL1 to RL4 is 1 k$\Omega$, the high frequency signal V1 is 100 dB$\mu$V and 150 MHz, and the high frequency signal V2 is 80 dB$\mu$V and 149 MHz. Incidentally, variations in characteristics of circuit elements were ignored.

The result was that, in the first prior art frequency mixer circuit, the offset voltage between the output terminals T1 and T2 is 14.3 mV, but in the embodiment of the frequency mixer circuit in accordance with the present invention, the offset voltage is 0.8 mV, which is about $\frac{1}{18}$ of the first prior art frequency mixer circuit.

As seen from the above, the frequency mixer circuit in accordance with the present invention is characterized in that the fifth and sixth transistors Q5 and Q6, which respectively constitute current sources for driving the pair of differential circuits 12 and 14, have their emitter directly connected to the second power supply voltage (exemplified by the ground voltage), and the first and second high frequency signals (exemplified by the local oscillation signal and the received signal) are supplied in the form of an unbalanced signal to one transistor of each differential transistor pair and one of the current source transistors, respectively. With this arrangement, the offset voltage in the output voltage can be effectively minimized, and therefore, the frequency mixer circuit can be coupled directly to a next stage circuit. Furthermore, the frequency mixer circuit in accordance with the present invention requires neither additional external terminals nor externally mounted circuit parts such as a capacitor having a large capacitance and a transformer, which are a hindrance in miniaturizing and in reducing the number of parts.

The invention has thus been shown and described with reference to the specific embodiments. However, it should be noted that the present invention is in no way limited to the details of the illustrated structures but changes and modifications may be made within the scope of the appended claims.

I claim:

1. A frequency mixer circuit comprising:

a first differential circuit composed of first and second transistors having common-connected emitters, and a second differential circuit composed of third and fourth transistors having common-connected emitters, a collector of said first transistor being connected to a collector of said third transistor and also connected through a first resistor to a first power supply voltage, a collector of said second transistor being, connected to a collector of said fourth transistor and also connected through a second resistor to said first power supply voltage, a base of said first transistor being connected to a base of said fourth transistor, and a base of said second transistor being connected to a base of said third transistor; and a fifth transistor having a collector connected to said common-connected emitters of said first and second transistors and an emitter connected to a second power supply voltage, and a sixth transistor having a collector connected to said common-connected emitters of said third and fourth transistors and an emitter connected to said second power supply voltage, said base of said first to fourth transistors being biased with a first bias voltage, and a first high frequency signal being applied in the form of an unbalanced signal to said base of said first and fourth transistors, and said base of said fifth and sixth transistors being biased with a second bias voltage, and a second high frequency signal being applied in the form of an unbalanced signal to said base of said fifth transistor.

2. A frequency mixer circuit claimed in claim 1 wherein said first high frequency signal is constituted of a local oscillation signal, and said second high frequency signal is constituted of a received signal.

3. A frequency mixer circuit claimed in claim 2 wherein said base of said second and third transistors are connected to said first bias voltage, and said first high frequency signal plus said first bias voltage is applied to said base of said first and fourth transistors, and wherein said base of said sixth transistor is connected to said second bias voltage, and said second high frequency signal plus said second bias voltage is applied to said base of said fifth transistor.

* * * * *